(12) United States Patent
Hironaka et al.

(10) Patent No.: US 10,770,371 B2
(45) Date of Patent: Sep. 8, 2020

(54) SEMICONDUCTOR DEVICE

(71) Applicant: Mitsubishi Electric Corporation, Tokyo (JP)

(72) Inventors: Yoichi Hironaka, Tokyo (JP); Masuo Koga, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 2 days.

(21) Appl. No.: 15/300,520

(22) PCT Filed: Jul. 9, 2014

(86) PCT No.: PCT/JP2014/068331
§ 371 (c)(1),
(2) Date: Sep. 29, 2016

(87) PCT Pub. No.: WO2016/006065
PCT Pub. Date: Jan. 14, 2016

(65) Prior Publication Data
US 2017/0170096 A1 Jun. 15, 2017

(51) Int. Cl.
*H01L 23/40* (2006.01)
*H01L 25/18* (2006.01)
(Continued)

(52) U.S. Cl.
CPC ........ *H01L 23/4006* (2013.01); *H01L 23/053* (2013.01); *H01L 23/433* (2013.01);
(Continued)

(58) Field of Classification Search
CPC . H01L 23/4006; H01L 23/053; H01L 25/072; H01L 23/433; H01L 2224/45147
See application file for complete search history.

(56) References Cited

U.S. PATENT DOCUMENTS

2010/0134979 A1\* 6/2010 Obiraki ............... H01L 23/3735
361/709
2010/0196709 A1\* 8/2010 Yodogawa ............... C08J 3/244
428/390
(Continued)

FOREIGN PATENT DOCUMENTS

JP  62-88178  \*  4/1987
JP  9-289283 A  11/1997
(Continued)

OTHER PUBLICATIONS

Machine translated document (JP 10-290000, Oct. 1998).\*
(Continued)

*Primary Examiner* — Ahmed N Sefer
(74) *Attorney, Agent, or Firm* — Studebaker & Brackett PC

(57) ABSTRACT

A base plate (1) made of a metal has a through-hole (2). An insulating substrate (3) is provided on the base plate (1). A semiconductor chip (4) is provided on the insulating substrate (3). A case (8) has a screw-hole (9) communicating with the through-hole (2), covers the insulating substrate (3) and the semiconductor chip (4), and is disposed on the base plate (1). A screw (11) made of a metal is inserted into the through-hole (2) and the screw-hole (9) to fix the case (8) to the base plate (1). A flexible material (12) having flexibility is filled in a cavity between a bottom surface of the screw-hole (9) in the case (8) and a distal end of the screw (11).

15 Claims, 4 Drawing Sheets

(51) Int. Cl.
  *H01L 23/053* (2006.01)
  *H01L 23/433* (2006.01)
  *H01L 25/07* (2006.01)
  *H01L 23/00* (2006.01)

(52) U.S. Cl.
  CPC ............ *H01L 25/072* (2013.01); *H01L 25/18* (2013.01); *H01L 24/45* (2013.01); *H01L 2023/4025* (2013.01); *H01L 2023/4087* (2013.01); *H01L 2224/32225* (2013.01); *H01L 2224/45124* (2013.01); *H01L 2224/45147* (2013.01); *H01L 2224/48227* (2013.01); *H01L 2924/0715* (2013.01); *H01L 2924/1033* (2013.01); *H01L 2924/10272* (2013.01); *H01L 2924/1305* (2013.01); *H01L 2924/15724* (2013.01); *H01L 2924/15747* (2013.01); *H01L 2924/186* (2013.01)

(56) References Cited

U.S. PATENT DOCUMENTS

| | | | | |
|---|---|---|---|---|
| 2011/0043239 | A1* | 2/2011 | Tomita | G01R 1/0735 324/756.03 |
| 2013/0224891 | A1* | 8/2013 | Takizawa | H01L 22/10 438/15 |
| 2014/0117979 | A1* | 5/2014 | Heimlicher | H03K 17/9505 324/207.16 |
| 2015/0289356 | A1* | 10/2015 | Izuo | H01L 23/13 361/709 |
| 2016/0079155 | A1* | 3/2016 | Kawase | H01L 23/3735 257/712 |

FOREIGN PATENT DOCUMENTS

| | | | |
|---|---|---|---|
| JP | H10-233482 | A | 9/1998 |
| JP | H10-290000 | A | 10/1998 |
| JP | 2006-32392 | * | 2/2006 |
| JP | 2006-032392 | A | 2/2006 |
| JP | 2010-186931 | A | 8/2010 |
| JP | 2013-074284 | A | 4/2013 |
| JP | 2014-120728 | A | 6/2014 |

OTHER PUBLICATIONS

Machine translated document (JP 2006-32392, Year: 2006).*

Notification of Transmittal of Translation of the International Preliminary Report on Patentability and Translation of Written Opinion of the International Searching Authority; PCT/JP2014/068331 dated Jan. 19, 2017.

International Search Report issued in PCT/JP2014/068331; dated Oct. 14, 2014.

Office Action issued by the Japanese Patent Office dated Jul. 11, 2017 in corresponding Japanese Application No. 2016-532357 with Partial English Translation; 22 pp.

An Office Action mailed by the State Intellectual Property Office of the People's Republic of China dated Jun. 1, 2018, which corresponds to Chinese Patent Application No. 201480080484.3 and is related to U.S. Appl. No. 15/300,520; with English Translation.

An Office Action mailed by the German Patent Office dated Oct. 18, 2019, which corresponds to German Patent Application No. 11 2014 006 796.2 and is related to U.S. Appl. No. 15/300,520.

\* cited by examiner

| DISCHARGE START VOLTAGE | — |
|---|---|
| DISCHARGE EXTINCTION VOLTAGE | — |
| MAX DISCHARGE INTENSITY | 2pC |
| APPLIED VOLTAGE | 6.9kV |
| APPLICATION TIME | 60SECOND |

SEMICONDUCTOR DEVICE

FIELD

The present invention relates to a semiconductor device including a base plate and a case fixed to each other with a screw.

BACKGROUND

In a semiconductor device such as a semiconductor power module oriented toward railroads, a base plate having heat dissipation and a case formed of a resin or the like containing a semiconductor chip are fixed to each other mainly with a metal tapping screw in terms of assembling property, fixing strength, and the like.

A screw-hole is formed to have a depth longer than that of the screw to prevent the bottom surface of the screw-hole in the case from interfering with the screw. For this reason, there is a cavity between the screw end and the bottom surface of the screw-hole when the screw is fastened. This cavity also has a role of absorbing swarf of the case made when the tapping screw screws in the screw-hole.

A semiconductor module oriented toward railroads normally treats a large amount of power. Thus, when an electric power is applied across high-potential parts (collector and emitter of a semiconductor chip, electrodes and metal wires coupled thereto, and the like) and low-potential parts, partial discharge may occur at an electric-field-concentrated part in an insulator.

The partial discharge serves as an index of insulating deterioration. For this reason, in a semiconductor power module oriented toward railroads, conditions related to partial discharge withstand voltage must be satisfied in application of a predetermined voltage (for example, when a rated voltage is 6.5 kV, 5.1 kV).

However, an electric field between the distal end of the metal tapping screw serving as the low-potential part and the high-potential part (for example, an electrode or a metal wire) having the minimum spatial distance from the distal end becomes strong to cause partial discharge in a cavity between the screw end and the bottom surface of the screw-hole so as to disadvantageously fall short of a partial discharge withstand voltage.

In recent years, in a next-generation power modules each using a wide-gap semiconductor chip such as an SiC or GaN the development and production of which have advanced, an increase in withstand voltage of the module has been advanced (for example, a related voltage 13 kV or 16 kV). An increase in withstand voltage of the module makes a request for the partial discharge withstand voltage more strict. Thus, the improvement in partial discharge withstand voltage is a technical issue essential for a higher withstand voltage of the next-generation power module.

In order to solve the issue, a semiconductor device in which a filler made of a high-withstand-voltage resin is filled in a cavity between the distal end of a metal tapping screw and the bottom surface of a screw-hole in a resin case and heated and hardened is proposed (for example, see Patent Document 1). The cavity is filled with the filler as described above to improve a withstand voltage. A semiconductor device including a filler hardened in advance and a method of manufacturing the semiconductor device are also proposed (for example, see Patent Document 2). The screw is fastened by hardening the filler in advance to make it possible to suppress a fluctuation in partial discharge characteristics.

CITATION LIST

Patent Literature

Patent Document 1: Japanese Unexamined Patent Publication No. 2006-32392
Patent Document 2: Japanese Unexamined Patent Publication No. 2013-74284

SUMMARY

Technical Problem

However, in the conventional art, although the level of the hardened filler must be controlled to the level of the cavity, a fluctuation in injection volume of the filler, a fluctuation in thermal contraction rate of the filler in thermal hardening, and the like make the control of level of the filler difficult. When the level of the filler is lower than that of the cavity, the remaining cavity blocks the partial discharge withstand voltage from being improved. When the level of the filler is higher than that of the cavity, the partial discharge withstand voltage fluctuates, and the repulsive elasticity of the filler causes deterioration of fixing strength of a screw, a loose screw, and the like.

In Patent Document 1, the metal tapping screw is fastened after a liquid high-withstand-voltage resin is injected into the screw-hole, and the high-withstand-voltage resin is hardened. However, the resultant structure must be left untouched until being hardened while a radiator plate side is faced upward not to cause the high-withstand-voltage resin to flow out of the screw-hole. A newly added thermosetting step allows the number of steps to increase so as to elongate a processing time. As a result, a manufactural throughput disadvantageously decreases.

The present invention has been made to solve the above problem, and has as its object to obtain a semiconductor device in which a partial discharge withstand voltage is improved to suppress a fluctuation in partial discharge withstand voltage caused by a production tolerance to make it possible to prevent a manufactural throughput from decreasing.

Solution to Problem

A semiconductor device according to the present invention includes: a base plate made of a metal and having a through-hole; an insulating substrate on the base plate; a semiconductor chip on the insulating substrate; a case having a screw-hole communicating with the through-hole, covering the insulating substrate and the semiconductor chip, and disposed on the base plate; a screw made of a metal and inserted into the through-hole and the screw-hole to fix the case to the base plate; and a flexible material having flexibility and filled in a cavity between a bottom surface of the screw-hole in the case and a distal end of the screw.

Advantageous Effects of Invention

In the present invention, the cavity between the bottom surface of the screw-hole in the case and the distal end of the screw is filled with the flexible material to make it possible to moderate a field intensity at the distal end of the screw and to improve the partial discharge withstand voltage of the semiconductor device. Since the flexible material having flexibility can be compressively filled in the cavity, the level of the flexible material need not be controlled to the same level as that of the cavity, and a fluctuation in partial discharge withstand voltages caused by a production tolerance of the flexible material and deterioration of fixing strength between the case and the base plate can be suppressed. Since only the step of inserting the flexible material into the screw-hole needs to be added and the thermosetting step is not necessary, the decrease of a manufactural throughput can be prevented.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
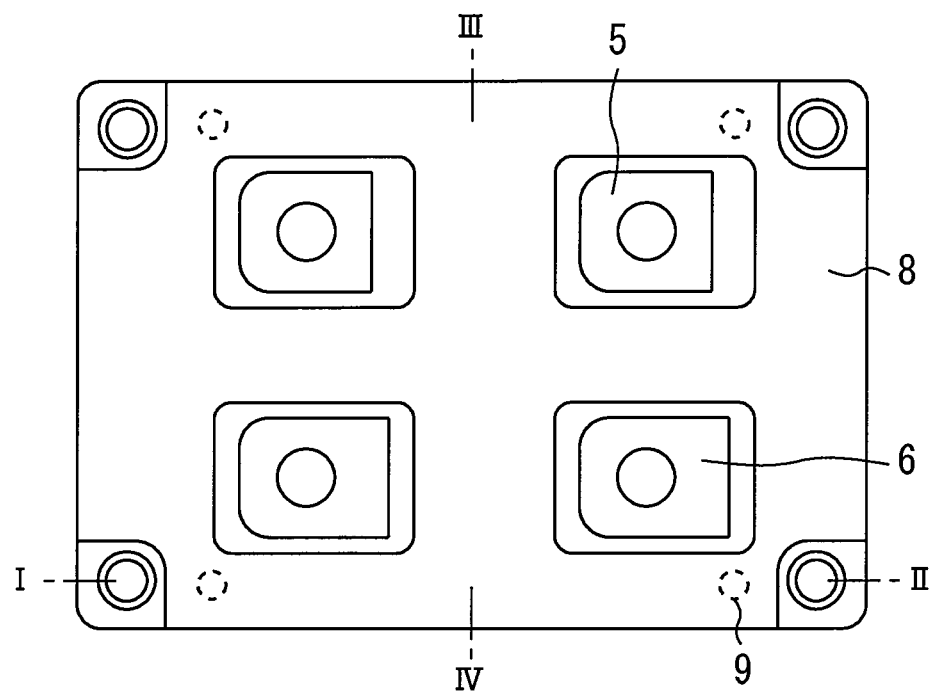
FIG. 1 is an upper view showing a semiconductor device according to a first embodiment of the present invention.
Figure 2:
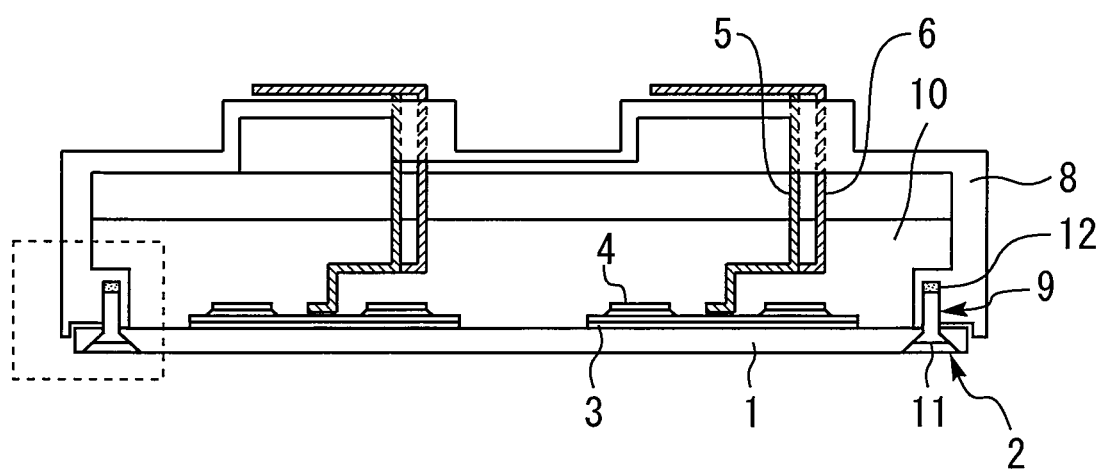
FIG. 2 is a sectional view along I-II in FIG. 1.
Figure 3:
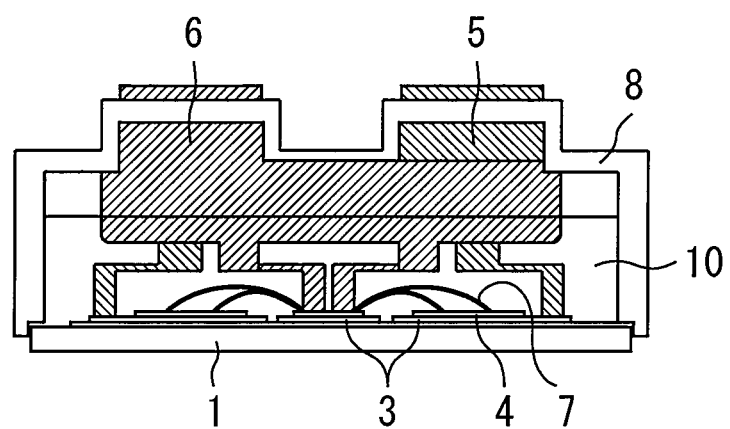
FIG. 3 is a sectional view along III-IV in FIG. 1.
Figure 4:
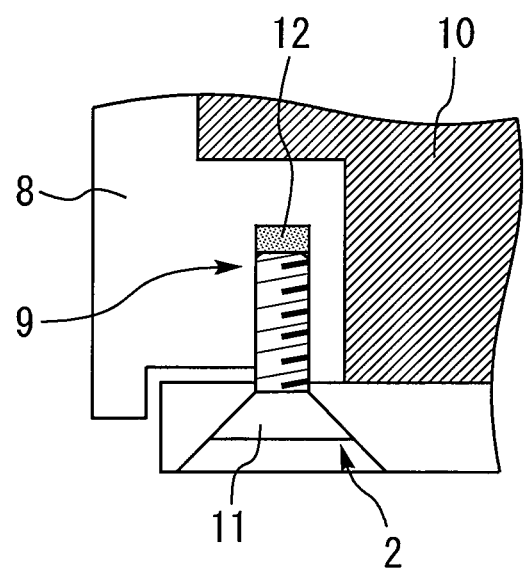
FIG. 4 is a sectional view of an enlarged part surrounded by a broken line in FIG. 2.

FIG. 1 is an upper view showing a semiconductor device according to a first embodiment of the present invention, FIG. 2 is a sectional view along I-II in FIG. 1, and FIG. 3 is a sectional view along III-IV in FIG. 1. FIG. 4 is a sectional view of an enlarged part surrounded by a broken line in FIG. 2. The semiconductor device is a semiconductor power module oriented toward railroads.

A base plate 1 is made of a metal such as copper or AlSiC having good heat conductivity, and has through-holes 2 at the four corners of the base plate 1. An insulating substrate 3 is disposed on the base plate 1. Electrode patterns made of copper, aluminum, or the like are disposed on the upper and lower surfaces of the insulating substrate 3. A semiconductor chip 4 is disposed on the insulating substrate 3.

A collector main electrode 5 and an emitter main electrode 6 each made of copper or the like are electrically coupled to the electrode pattern on the upper surface of the insulating substrate 3. A metal wire 7 made of aluminum or copper electrically couples the emitter terminal of the semiconductor chip 4, the upper-surface electrode pattern on the insulating substrate 3, and the emitter main electrode 6 to each other.

A case 8 is mainly made of an insulating material such as a resin, has screw-holes each communicating with a corresponding one of the through-hole 2, covers the insulating substrate 3 and the semiconductor chip 4, and is disposed on the base plate 1. A sealing material 10 made of an insulating material such as silicone gel covers the semiconductor chip 4, the insulating substrate 3, and the metal wire 7 in a space in the case 8. Screws 11 made of a metal such as iron are inserted into the through-holes 2 and the screw-holes 9 to fix the case 8 to the base plate 1.

A flexible material 12 having flexibility is compressed and filled in each cavity between the bottom surfaces of the screw-hole 9 in the case 8 and the distal end of the screw 11. The volume of the uncompressed flexible material 12 is larger than that of each of the cavities. More specifically, a minimum allowable volume obtained by a fluctuation in dimensions unavoidable when the flexible material 12 is manufactured is made equal to or larger than the volume of the cavities. The flexible material 12 mentioned here is an insulating silicone rubber sponge machined into a columnar shape. The volume is approximately ($\Phi 3 \times$height of 3 mm=approximately 21 mm$^3$, and is sufficiently larger than the design volume (center value) of the cavity, i.e., approximately $\Phi 2.8 \times$height of 0.8 mm=approximately 5 mm$^3$. The shape of the flexible material 12 is, for example, a columnar shape, a rectangular parallelepiped, or the like. However, as long as the volume conditions described above are satisfied and the workability of insertion into the screw-hole 9 is preferable, any shape may be employed. For example, a shape having a groove in the surface thereof, a tapered shape, or the like which is difficult to be removed from the screw-hole 9 is preferably used.

The flexible material 12 has a heat resistance higher than the maximum operative temperature of the semiconductor device. The flexible material 12 has a volume resistivity of $2.8 \times 10^{15}$ [$\Omega$cm] and a higher insulation than that of the air. The flexible material 12 satisfying these conditions is, for example, silicone rubber sponge, a fluorocarbon rubber sponge, or the like.

Figure 5:
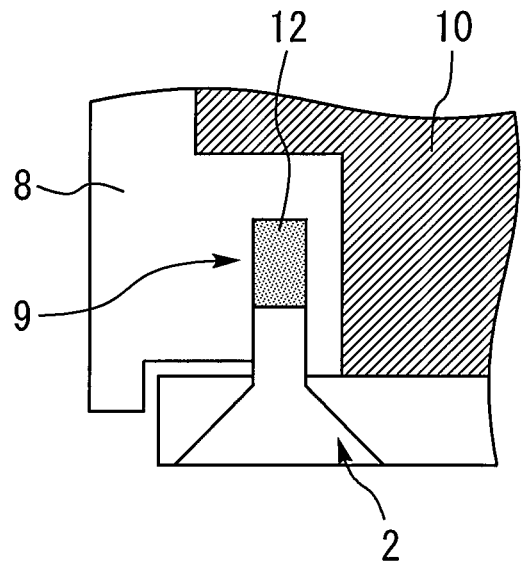
FIG. 5 is a sectional view for explaining a method of filling a flexible material.

FIG. 5 is a sectional view for explaining a method of filling a flexible material. First, as shown in FIG. 5, the flexible material 12 is inserted into the screw-hole 9. The screw 11 is fastened, as shown in FIG. 4, to compressively fill each of the cavities between the bottom surfaces of the screw-holes 9 in the case 8 and the distal ends of the screws 11 with the flexible material 12 until the volume of each of the cavity is filled.

Figure 6:
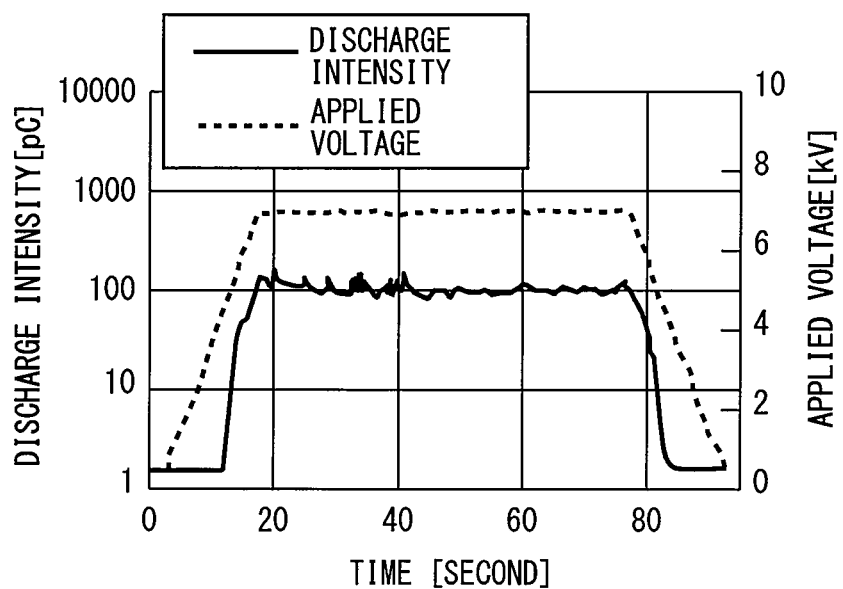
FIG. 6 is a graph showing partial discharge characteristics in the comparative example.
Figure 7:
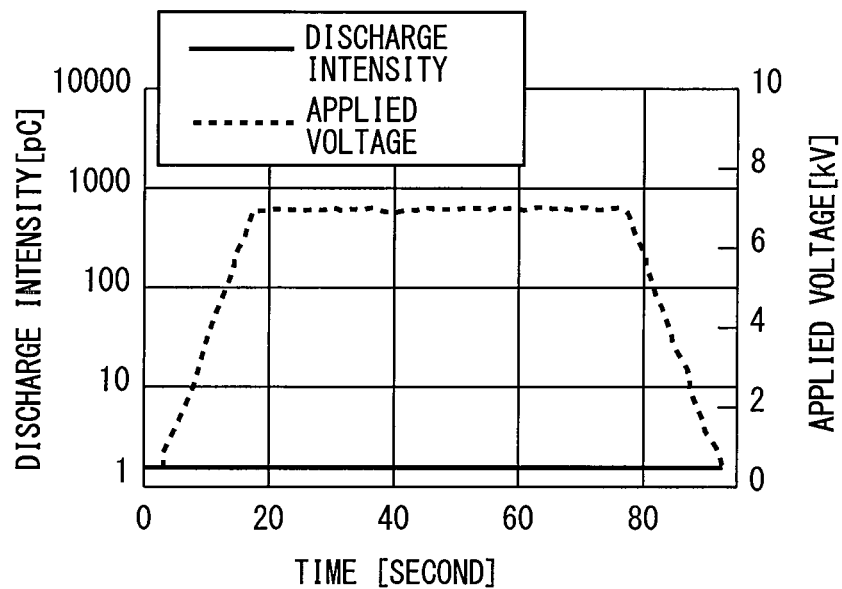
FIG. 7 is a graph showing partial discharge characteristics in the first embodiment.

Subsequently, the result of the embodiment will be described below in comparison with a comparative example. The comparative example is different from the first embodiment in that the flexible material 12 is not present. FIG. 6 is a graph showing partial discharge characteristics in the comparative example. FIG. 7 is a graph showing partial discharge characteristics in the first embodiment. In the comparative example, a partial discharge start voltage (voltage obtained when a discharge intensity is higher than 10 pC) in application of a voltage was 4.9 kV, and a partial discharge extinction voltage (voltage obtained when a discharge intensity is lower than 10 pC) was 5.1 kV. On the other hand, in the first embodiment, partial discharge did not occur in application of a voltage. Thus, it was understood that a partial discharge withstand voltage in the first embodiment is better than that in the comparative example.

As described above, in the embodiment, each of the cavities between the bottom surfaces of the screw-holes 9 in the case 8 and the distal ends of the screws 11 is filled with the flexible material 12 to make it possible to moderate field intensities at the distal ends of the screws 11 and to improve the partial discharge withstand voltage of the semiconductor device.

Since the flexible material 12 having flexibility can be compressively filled in the cavity, the level of the flexible material 12 need not be controlled to the same level as that of the cavity, and a fluctuation in partial discharge withstand voltages caused by a production tolerance of the flexible material 12 and deterioration of fixing strength between the case 8 and the base plate 1 can be suppressed. Since only the step of inserting the flexible material 12 into the screw-hole 9 needs to be added and the thermosetting step is not necessary, the decrease of a manufactural throughput can be prevented.

The volume of the uncompressed flexible material 12 is made larger than the volume of the cavity to make it possible to suppress a fluctuation in partial discharge withstand voltage caused by production tolerance of the flexible material 12 to be filled.

Since the flexible material 12 has a heat resistance higher than the maximum operating temperature of the semiconductor device, a void filling function can be maintained even in a high-temperature operating environment. Since the flexible material 12 has insulativity higher than that of the air to improve the withstand voltage of the filled portion, the partial discharge withstand voltage and the dielectric breakdown endurance of the semiconductor device can be further improved. An insulating screw may be used as the screw 11. Since the insulating screw is insulated from the base plate 1, the partial discharge withstand voltage further increases.

Second Embodiment

Figure 8:
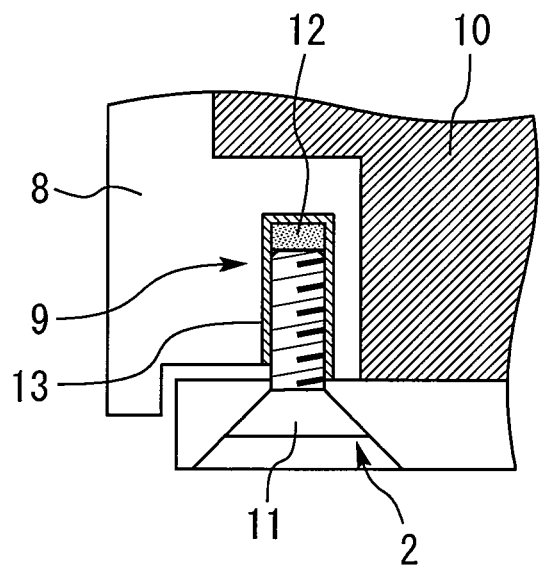
FIG. 8 is a sectional view showing a semiconductor device according to a second embodiment of the present invention.

FIG. 8 is a sectional view showing a semiconductor device according to a second embodiment of the present invention. A conductive coat 13 such as a metal plating film is applied to the side surfaces and the bottom surfaces of the screw-holes 9 in the case 8. The other configuration is the same as that in the first embodiment.

The conductive coat 13 can make potentials of the screw 11 and the bottom surface of the screw-hole 9 grounded through the base plate 1 equal to each other. Since an electric field intensity between equal potentials is generally lower than an electric field intensity between different potentials, the electric field intensity at the distal end of the screw 11 is further modified in comparison with the first embodiment to make it possible to improve the partial discharge withstand voltage of the semiconductor device.

Third Embodiment

In a third embodiment, the flexible material 12 is a material having a heat resistance higher than the maximum operating temperature of the semiconductor device and conductivity higher than that of the semiconductor device. For example, the flexible material 12 is a conductive silicone rubber sponge or a conductive fluorocarbon rubber sponge machined into a cube. The volume of the conductive silicone rubber sponger is length of 3 mm×width of 3 mm×height of 3 mm=approximately 27 mm$^3$, and is sufficiently larger than the design volume (center value) of the cavity, i.e., approximately Φ2.8×height of 0.8 mm=approximately 5 mm$^3$. The flexible material has a volume resistivity of $3.0\times10^4$ [Ωcm], is not a perfect conductor but a material having conductivity. The other configuration is the same as that in the first embodiment.

Since the conductive coat 13 having conductivity can make the potentials of the screw 11 and the bottom surface of the screw-hole 9 grounded through the base plate 1 equal to each other, the same advantage as that in the second embodiment can be obtained. Furthermore, since the potentials of the screw 11 and the bottom surface of the screw-hole 9 are made equal to each other only by insertion of the flexible material 12, a production cost can be made lower than that in the second embodiment, and the assembly workability can be improved. Although the shape of the flexible material 12 is different from that in the first embodiment, the improvement of the partial discharge withstand voltage could be confirmed regardless of the shape of the flexible material 12. Thus, when the volume conditions are satisfied, and the workability of insertion into the screw-hole 9 is preferable, the improvement effect of the partial discharge withstand voltage is independent of the shape of the flexible material 12.

The semiconductor chip 4 needs not only be formed by silicon or may be formed by a wide-band gap semiconductor having a band gap larger than that of silicon. The wide-band gap semiconductor, for example, is formed of silicon carbide, a gallium-nitride-based material, or diamond. In this manner, an increase in withstand voltage of the semiconductor device and improvement of a partial discharge withstand voltage allow an extra-high withstand voltage device to be achieved. Since the semiconductor chip 4 formed of a wide-band gap semiconductor has a high withstand voltage and a high allowable current density, the semiconductor chip 4 can be miniaturized. The miniaturized semiconductor chip 4 is used to make it possible to miniaturize the semiconductor device in which the semiconductor chip 4 is built. Since the heat resistance of the semiconductor chip 4 is high, a heat-radiation fin of a heat sink can be miniaturized to make it possible to replace a water-cooling system with an air-cooling system. For this reason, the semiconductor device can be further miniaturized. Since the semiconductor chip 4 has a low power loss and high efficiency, a high-efficiency semiconductor device can be achieved.

REFERENCE SIGNS LIST 1 base plate; 2 through-hole; 3 insulating substrate; 4 semiconductor chip; 8 case; 9 screw-hole; 11 screw; 12 flexible material; 13 conductive coat

The invention claimed is:
1. A semiconductor device comprising:
a base plate made of a metal and having a through-hole;
an insulating substrate on the base plate;
a semiconductor chip on the insulating substrate;
a case having a screw-hole formed only partially through the case, communicating with the through-hole, covering the insulating substrate and the semiconductor chip, and disposed on the base plate;
a screw made of a metal and inserted into the through-hole and the screw-hole to fix the case to the base plate; and
a flexible material having flexibility, compressed and filled in a cavity between a bottom surface of the screw-hole in the case and a distal end of the screw, wherein
volume of the flexible material when it is uncompressed is larger than that of the cavity,
an electrically conductive coat is applied to a side surface and the bottom surface of the screw-hole in the case, and
the entire flexible material is composed of only a silicone rubber sponge or a fluorocarbon rubber sponge.
2. The semiconductor device of claim 1, wherein the flexible material has a heat resistance higher than maximum operative temperature of the semiconductor device.

3. The semiconductor device of claim 1, wherein the flexible material has an insulation higher than that of an air.

4. The semiconductor device of claim 1, wherein the flexible material is a material having conductivity.

5. The semiconductor device of claim 1, wherein the semiconductor chip is formed by a wide-band gap semiconductor.

6. A semiconductor device comprising:
a base plate made of a metal and having a through-hole;
an insulating substrate on the base plate;
a semiconductor chip on the insulating substrate;
a case having a screw-hole, defined by sidewalls and a bottom, each formed by the case, the screw-hole communicating with the through-hole, covering the insulating substrate and the semiconductor chip, and disposed on the base plate;
a screw made of a metal and inserted into the through-hole and the screw-hole to fix the case to the base plate; and
a flexible material having flexibility, compressed and filled in a cavity between a bottom surface of the screw-hole in the case and a distal end of the screw, wherein
volume of the flexible material when it is uncompressed is larger than that of the cavity,
an electrically conductive coat is applied to the sidewalls and the bottom of the screw-hole in the case, and
the entire flexible material is composed of only a silicone rubber sponge or a fluorocarbon rubber sponge.

7. The semiconductor device of claim 6, wherein the flexible material has a heat resistance higher than maximum operative temperature of the semiconductor device.

8. The semiconductor device of claim 6, wherein the flexible material has an insulation higher than that of an air.

9. The semiconductor device of claim 6, wherein the flexible material is a material having conductivity.

10. The semiconductor device of claim 6, wherein the semiconductor chip is formed by a wide-band gap semiconductor.

11. A semiconductor device comprising:
a base plate made of a metal and having a through-hole;
an insulating substrate on the base plate;
a semiconductor chip on the insulating substrate;
a case having a screw-hole communicating with the through-hole, covering the insulating substrate and the semiconductor chip, and disposed on the base plate;
a screw made of a metal and inserted into the through-hole and the screw-hole to fix the case to the base plate; and
a flexible material having flexibility, compressed and filled in a cavity between a bottom surface of the screw-hole in the case and a distal end of the screw, wherein
volume of the flexible material when it is uncompressed is larger than that of the cavity,
an electrically conductive coat is applied to a side surface and the bottom surface of the screw-hole in the case, and
the entire flexible material is composed of only a fluorocarbon rubber sponge.

12. The semiconductor device of claim 11, wherein the flexible material has a heat resistance higher than maximum operative temperature of the semiconductor device.

13. The semiconductor device of claim 11, wherein the flexible material has an insulation higher than that of an air.

14. The semiconductor device of claim 11, wherein the flexible material is a material having conductivity.

15. The semiconductor device of claim 11, wherein the semiconductor chip is formed by a wide-band gap semiconductor.

\* \* \* \* \*